United States Patent [19]

Hücking et al.

[11] Patent Number: 4,709,228
[45] Date of Patent: Nov. 24, 1987

[54] ELECTRONIC DATA INPUT KEYBOARD COMPRISING KEYS PROVIDED WITH CONDUCTIVE CONTACTS

[75] Inventors: Ernst E. Hücking; Karl-Heinz Klemmt, both of Siegen, Fed. Rep. of Germany

[73] Assignee: U.S. Philips Corporation, New York, N.Y.

[21] Appl. No.: 720,787

[22] Filed: Apr. 8, 1985

[30] Foreign Application Priority Data

Aug. 9, 1984 [DE] Fed. Rep. of Germany ....... 3429309

[51] Int. Cl.$^4$ ................................................. G06F 3/02
[52] U.S. Cl. .............................. 340/365 S; 340/365 E
[58] Field of Search ............ 340/365 S, 365 R, 365 E; 328/128, 127

[56] References Cited

U.S. PATENT DOCUMENTS

| 3,676,697 | 7/1972 | Davenport | 328/128 |
| 4,374,384 | 2/1983 | Moates | 340/365 S |
| 4,502,039 | 2/1985 | Vercesi et al. | 340/365 S |
| 4,614,937 | 9/1986 | Poujois | 340/365 R |

FOREIGN PATENT DOCUMENTS 2449388 12/1980 France .

OTHER PUBLICATIONS

Joseph E. Jesson, "Smart Keyboards Help Eliminate Entry Errors" Computer Design/Oct. 1982, pp. 137, 138, 140 and 142.
"Varicap Compensation of Output Amplifiers", IBM Tech. Discl. Bulletin, vol. 27, No. 11, Apr. 1985.

Primary Examiner—John W. Caldwell, Sr.
Assistant Examiner—Tyrone Queen
Attorney, Agent, or Firm—Anne E. Barschall; Marianne Rich; William J. Streeter

[57] ABSTRACT

In matrix keyboards whose keys are provided with conductive contacts and are arranged at respective crosspoints of conductors, a diode is connected in series with each key contact in order to allow for n-key roll-over, i.e. the simultaneous actuation of several keys in an arbitrary configuration. For many technical realizations of the key contacts, for example in the form of electrically conductive materials provided on plastics foils by silkscreening, the series connection of a diode with each contact element is not simply possible. In accordance with the invention it is proposed to connect an ohmic resistor, which can also be provided by means of a silkscreening process, in series with each key contact and to connect the interrogated matrix conductors to a point of low impedance. Thus, current control is used to a high degree in order to ensure that no signal voltage which is capable of exerting an effect via other actuated keys can appear on the interrogated conductor. The point of low impedance is effectively formed by the inverting input of an operational amplifier which is fed back by means of a resistor.

7 Claims, 3 Drawing Figures

ELECTRONIC DATA INPUT KEYBOARD COMPRISING KEYS PROVIDED WITH CONDUCTIVE CONTACTS

BACKGROUND OF THE INVENTION

The invention relates to an electronic data input keyboard comprising keys provided with conductive contacts, these keys being associated with crosspoints of a conductor matrix consisting of a number of column conductors and a number of row conductors and coupling, upon actuation, each time one of the column conductors to one of the row conductors via an uncoupling element which is connected in series with the contact, the conductors of one matrix coordinate (for example, column conductors) successively receiving a scanning pulse from a control circuit, the conductors of the other matrix coordinate (for example, row conductors) being interrogated for the occurrence of the scanning pulse by means of an evaluation circuit.

Such a keyboard is generally known, for example from the magazine "Computer design", October 1982, pages 137–142.

This article mentions that contemporary data input keyboards generally require a feature which is referred to as "n-key rollover". This is to be understood as the capability of the keyboard to output always the appropriate electrical signal when a key is depressed, regardless whether any previously depressed keys have meanwhile been released or not. The symbol "N" serves to indicate that an arbitrary number of (N) keys can remain depressed without the operation of the $(N+1)^{th}$ key being disturbed. Such keyboard behavior is presently considered an absolute necessity of fast, ambidextrous input, because in given sequences and beyond a given speed the keys are struck faster than they are released, so that temporarily several keys are simultaneously in the depressed state; it being unacceptable for errors to occur in the recognition of the sequence in which the keys have been actuated.

FIG. 1 shows the circuit diagram of the known device. This Figure shows, by way of example, a small matrix which comprises four columns S1 to S4 and four rows Z1 to Z4. To each of the sixteen crosspoints there may be connected a key switch which connects, in its closed condition, the relevant column conductor to the associated row conductor through a diode which serves as an uncoupling element. In FIG. 1 three closed switches are shown by way of example in the form of diodes 22, 24 and 42. The contacts at the other crosspoints of the matrix are assumed to be open and have been omitted for the sake of clarity.

The electronic control system consists of a control section ST which cyclically applies a scanning pulse to the column conductors and an interrogation section A which monitors all row conductors for the appearance of the scanning pulse. Nowadays the control section and the interrogation section are preferably combined in an integrated microprocessor which also performs other functions.

When the control section ST applies the scanning pulse to the column conductor S1 as shown in FIG. 1, the interrogation section A will not detect a pulse potential on any of the four rows Z1 to Z4, because there if no conductive connection between S1 and Z1 to Z4.

When the control section ST applies the pulse to the column S2 at another instant, the interrogation section A will detect a pulse potential on the conductors Z2 and Z4 because corresponding conductive conductors are present, for example, the keys 22 and 24 are depressed.

Similarly, when the scanning pulse is applied to S4, a pulse potential will be detected on Z2 because the existing connection, for example, the depressed key 42. If the diodes were absent, however, the pulse potential would now also appear on Z4, which is completely undesirable. This occurs because as seen from the Figure a conducting conductor would then extend from S4 to Z2 and therefrom to S2 and further to Z4. This means that the interrogation circuit reacts as if the key at S4, Z4 were also closed, though that is not the case. Such positions in a switch matrix are referred to as "phantoms". When three of a number of simultaneously depressed keys form the corner points of a rectangle, the fourth corner point always represents such phantom. The diodes prevent such phantoms, because the diode which is connected in series with the key 22 in the described embodiment presents influencing of the column S2.

Several possibilities exist as regards the construction of key switches comprising conductive contacts. An example of a conductive keyboard which is described in this article is formed by a membrane keyboard. Therein, the contact points are printed on plastics foils, together with the connection conductors, in the form of planar elements consisting of an electrically conductive material which is suitable for silkscreening. The contact spots of two foils are arranged so as to face one another and are separated by a spacer foil which is perforated at the area of each contact spot. When a contact spot is pressed, it contacts the contact spot on the oppositely arranged foil through the hole in the spacer foil.

In such a membrane keyboard, however, it is virtually impossible to connect diodes to the silkscreened conductor pattern on a plastics foil. Soldering is impossible because of the temperature sensitivity of the foil and the silkscreening paste. Bonding of chip diodes as customarily used for silkscreened conductor patterns on ceramic substrates is not feasible for several reasons (cumbersome, usable only on hard substrates, mechanically vulnerable). Crimping by means of metal clamps and the like is problematic because of lack of reliability and space requirements.

Previous attempts have been made to provide an n-key rollover-type behaviour for such keyboards without diodes by distributing the individual keys of a field across the matrix so that the probability of occurrence of phantoms was minimized. Furthermore, it was attempted to control the phantom situations still occurring by a suitable composition of the microprogram of the electronic control system, i.e. by intermediate storage of the coordinates of the keys invovled in a phantom formation until the situation is resolved by the release of one of the relevant keys.

However, these steps could not ensure that a truly arbitrary number of keys in arbitrary positions on the keyboard could be simultaneously depressed in a rollover sequence without ever giving rise to errors. Such keyboards have an n-key rollover behaviour such that the number N fluctuates in dependence of the keys depressed and can decrease to as low as 2 from case to case. This behaviour is in conflict with the ergonomic requirements.

Moreover, in such a keyboard all keys which must be depressed during the actuation of other keys (upper case/lower case and other multiple keys) must be removed from the matrix in order to be separately connected to the electronic control circuitry. If this is not done, irresolvable phantom situations will occur notably when several multiple keys are used. Besides the drawback of these separate connections, there is another problem when use is made of freely programmable keys which must also be programmable as multiple keys. This is because in such cases it is not known in advance which keys will be involved so that in an extreme case all programmable keys should be removed from the matrix in order to be separately connected. Considering the growing importance of programmable keys in modern data processing systems, this may be a prohibitive drawback.

SUMMARY OF THE INVENTION

It is the object of the invention to provide an electronic data input keyboard of the kind set forth which allows for an arbitrary N-key rollover or operation of the keys with an arbitrary number of simultaneously depressed keys, which has a simple construction and which is suitable also for membrane keyboards comprising silkscreened conductor tracks on plastics foils.

This object is achieved in accordance with the present invention in that each of the interrogated coordinate conductors is connected to a point of low impedance, the uncoupling element being an ohmic resistor whose value is high in comparison with the low impedance. The basic idea of the invention consists in that all row conductors are connected to points of low impedance at least during the interrogation.

This is because the steps in accordance with the invention ensure that essentially current control takes place instead of voltage control, so that only very small voltages arise on the interrogated conductors and the appearance of phantom keys is precluded with certainty even when diodes are omitted.

The ohmic resistors arranged in series with each key contact can be provided in various ways. Notably for keyboards whose conductive key contacts consist of contact surfaces formed on plastics foils by silkscreening, the ohmic resistors which are arranged in series with each key contact are effectively also provided by silk screening. The elements for uncoupling the individual keys can thus be reliably deposited without damaging of the plastics foil; moreover, this step enables a particularly economical manufacturing method.

The point of low impedance can be provided in various ways, for example by way of a low-ohmic resistor connected to a reference point, in which case the interrogated coordinate conductors must be connected to the input of an amplifier having a sufficiently high gain, for example an operational amplifier. Another realization of the points of low impedance in accordance with the present invention is characterized in that each point of low impedance is formed by the inverting input of an operational amplifier whose output is also connected to the inverting input through a further resistor and whose non-inverting input receives a fixed reference voltage. The operational amplifier is thus used not only for amplification but also for forming the point of low impedance. The reference voltage may not be equal to the pulse voltage applied to the columns for the detection of the actuated keys.

The inverting input of an operational amplifier thus fed back, however, represents a point of low impedance only for as long as the output signal of the operational amplifier remains in the linear range of gain. In order to prevent overdriving of the operational amplifier, for example due to component tolerances, a diode, preferably a zener diode, is effectively connected, parallel to the further resistor, between the output and the inverting input of each operational amplifier. As a result, the output signal of the operational amplifier will be limited and the input will always represent a point of low impedance, even in the case of large input currents.

Because each of the interrogated coordinate conductors is connected to a point of low impedance, the coordinate conductors will also be comparatively insensitive to externally induced electrical signals. When an even better protection against interference is desired, a capacitor can be effectively connected, parallel to the further resistor, between the output and the inverting input of each operational amplifier. The operational amplifier thus also acts as an integrator which is particularly insensitive to brief signal pulses on its input.

The invention will be described in detail hereinafter with reference to the accompanying drawings.

DESCRIPTION OF THE PREFERRED EMBODIMENT

FIG. 2 again shows, by way of an example, a 4×4 switch matrix, ony three closed switches 22, 24 and 42 being shown while the other switches which are assumed to be open for the purpose of this description have been omitted. The column conductors S1 to S4 time sequentially receive scanning pulses from the control section ST. Each of the row conductors Z1 to Z4 is connected to a point of low impedance which is formed by the inverting input of a respective operational amplifier OP1 to OP 4 in the embodiment shown.

As is known, an operational amplifier is to be understood to mean a linear amplifier element whose gain is so high and whose other characteristics so closely approximate those of the ideal amplifier for a given application that its behaviour in the circuit is influenced only by the external components. In addition to an output, customary amplifiers of this kind have an inverting input and a non-inverting input.

Figure 1:
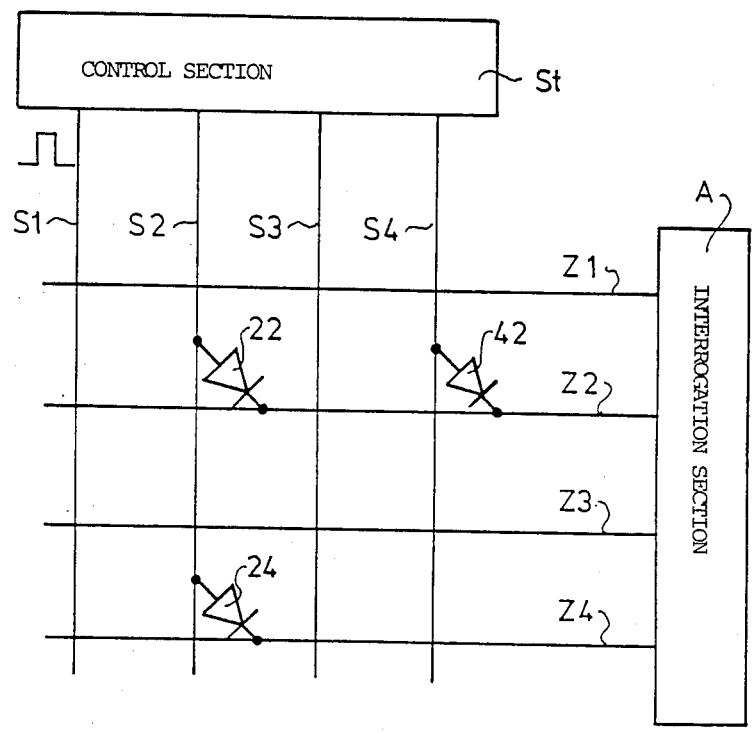
FIG. 1 shows the circuit diagram of a known keyboard.
Figure 2:
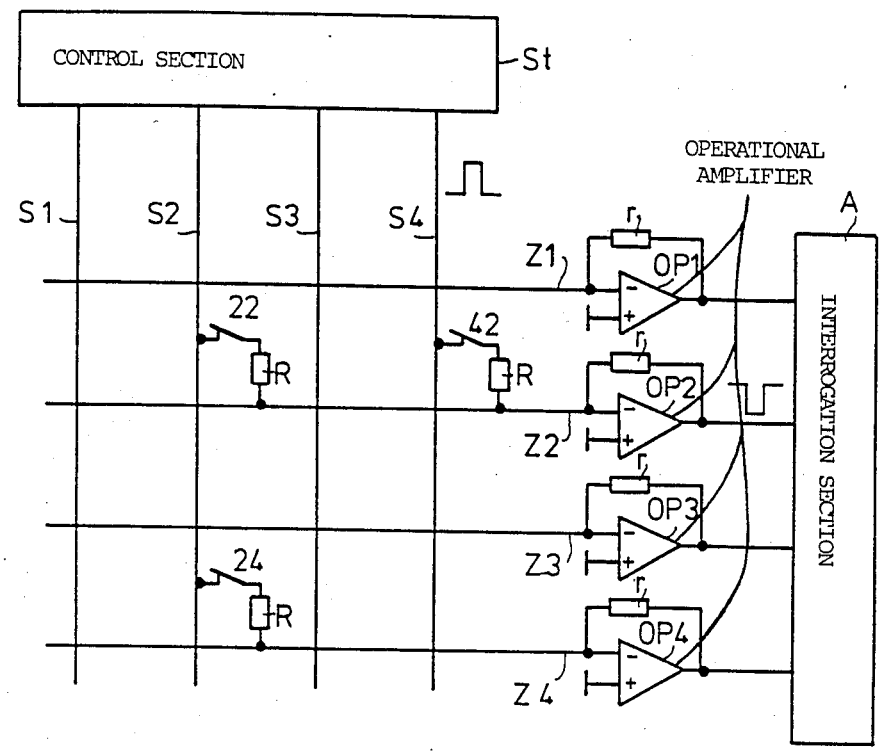
FIG. 2 shows the circuit diagram of a keyboard in accordance with the present invention.

As appears from FIG. 2, the row conductors are connected to the inverting inputs (−) of the operational amplifiers. Between the output and the inverting input of each amplifier there is also connected a resistor r which provides negative feedback. The non-inverting input (+) is connected to a fixed reference voltage which is in this case the common reference potential of the entire circuit, i.e. ground potential.

As is known, such a configuration has the property that the inverting input forms a so-called virtual ground point. This is because, due to the high gain of the amplifier element, the potential difference between the two inputs always remains negligibly small for as long as the amplifier is operative in its linear range. The inverting input thus has the property of a summing point whereto currents from different sources can flow without causing a change of its voltage potential with respect to the reference potential on the non-inverting input.

In series with each key switch in FIG. 2 there is also connected a resistor R. The arrangement operates as follows:

When the scanning pulse which is time sequentially applied to the various column conductors S1 to S4 by the control section ST appears, for example on column conductor S4, a current will flow for the duration of the pulse to summing point at the the inverting input (−) of the operational amplifier OP2 via the closed key switch 42 and the subsequent resistor R. Consequently, the scanning pulse will appear with a reversed polarity on the output of OP2 with an amplitude which is determined in known manner by the ratio r:R.

Because, as has already been explained, the inverting input (−) represents a virtual ground point, the voltage potential of the row conductor 22 will not be influenced, i.e. the scanning pulse will not appear as a voltage pulse thereon. Consequently, in spite of the closed switch 22, Z2 will not influence S2 and so on, so that the phantom previously observed at the crosspoint S4, Z4 no longer occurs. The matrix is free of phantom in all operative states, because each row conductor is connected to a virtual ground point.

The evaluation of the scanning pulses now appearing in inverted form on the outputs of the operational amplifiers is performed in a known manner by the interrogation section A.

The realization of the points of low impedance is not restricted to the example described with reference to FIG. 2. For example, the operational amplifiers can be omitted and each of the row conductors can be connected to the reference potential via a respective resistor; for this purpose a resistance value should be chosen which is small in comparison with R. Though the ideal situation of a virtual ground point is then given up, the pulse voltages now occurring on the row conductors can again be maintained at such a low value that influencing of the column conductors is effectively avoided. For evaluation these small pulse voltages must be amplified; this can be done, for example in the interrogation section.

It is alternatively possible to use only one operational amplifier which is cyclically connected to the various row conductors by means of an analog multiplexer. The multiplexer must be constructed so that the row conductors which are not connected to the operational amplifier at a given instant are directly connected to the reference potential in a low-ohmic fashion so that influencing of the column conductors is avoided.

The columns and rows may also be arranged in an interchanged manner, in which case it is merely necessary to adapt the drawing accordingly. Furthermore, the non-inverting inputs (+) of the operational amplifiers of the embodiment shown in FIG. 2 can be connected to another fixed reference voltage instead of the common reference potential, i.e. ground potential of the entire circuit, it merely being necessary for the reference voltage to be different from the pulse voltage of the scanning pulse. Thus, inter alia the d.c. voltage potentials on the outputs of the operational amplifiers change which may be desirable for adaptation to the level of the interrogation section A. The interrogation section A may also comprise additional means for adapting the level of the outputs of the operational amplifiers to the inputs of customary logic components.

As is known, the inverting input of operational amplifiers having a construction as shown in FIG. 2 represents a virtual ground point only for a long as the amplifier operates in its linear range. As soon as the amplifier is overdriven, the gain breaks down to approximately zero and no negative feedback will occur via the resistor r. Consequently, the potential on the inverting input will start to deviate from that on the non-inverting input and influencing becomes possible through the other simultaneously closed key contacts. Therefore, taking into account all tolerances, the circuit should be proportioned so that an operational amplifier will never be overdriven. If this cannot be achieved for the given component tolerances, overdriving can be prevented by arranging a semiconductor diode in known manner between the output and the inverting input of each operational amplifier.

Figure 3:
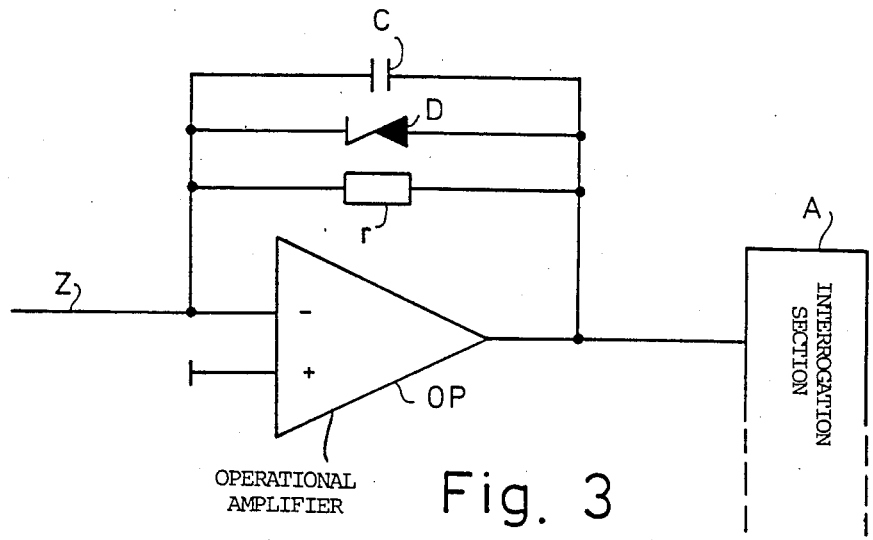
FIG. 3 shows a detailed circuit diagram of the operational amplifier used therein.

This step will be explained with reference to FIG. 3. This Figure shows an operational amplifier OP which is connected to a row conductor Z and the interrogation section A. A semiconductor diode D is connected parallel to the feedback resistor r. In accordance with the desired effect, this diode may be formed by any suitable diode or a combination of several diodes. The present embodiment utilizes a zener diode to good advantage because such a diode has a limiting effect at both sides. In the embodiment shown, the output voltage of the amplifier is limited to the forward voltage in the positive direction (approximately 0.6 V) and in the negative direction to the value of the reverse breakdown voltage which depends on the type chosen. This limit is reached before the overdrive limit of the amplifier is reached, because the diode becomes conductive so that the feedback loop remains fully operational and the property of the virtual ground point at the inverting input is maintained.

Contemporary keyboards are expected to be protected against faults due to external electrical signals. Such signals may originate, for example from electrostatic discharges or interference signals from electrical apparatus operating in the vicinity. The keyboard in accordance with the present invention is also attractive in this respect, because the row conductors are extremely low-ohmic so that they are less inclined to act as receiving aerials for such interference signals than in the case of higher impedances. If desirable, this advantage can be extended by a step which is also shown in FIG. 3. This step includes addition of the capacitor C parallel to the resistor r. This capacitor can be used with or without the diode D and imparts a low-pass nature to the amplifier circuit in known manner, so that the amplification of the interference signals which are present mainly in range of higher frequencies is further reduced, without the actual operation being influenced.

The described arrangement is particularly advantageous when used in membrane keyboards in which, as has already been described, the introduction of the diodes so far required for a full n-key rollover behavior is impossible. The resistors R, however, can be simply deposited on the same foils as those supporting the contact spots by means of customary resistance pastes in the silkscreening technique. The use of the resistors R, however, is not restricted to membrane keyboards; they can be advantageously used for all constructions where the provision of the diodes required so far in the matrix is problematic.

This notably also concerns keyboards comprising switching pads of silicon rubber where the clearance between the caps is often insufficient and contacting problems are also encountered. The resistors R can again be silkscreened onto the printed circuit board already present in such a type.

What is claimed is:

1. An electronic data input keyboard with n-key rollover comprising a plurality of keys provided with conductive contacts, each key being associated with a crosspoint of a current-controlled conductor matrix having a plurality of column conductors and a plurality of row conductors, each key coupling upon actuation, the column conductor to the row conductor of said associated crosspoint through an ohmic resistor (R) which is connected in series with said conductive contact of said key, the conductors of one matrix coordinate successively receiving a scanning pulse from a control circuit, the conductors of the other matrix coordinate being monitored for the occurrence of the scanning pulse by an evaluation circuit, each of said conductors of said monitored coordinate being connected to a point of low impedance, the value of said ohmic resistor (R) being high in comparison with said low impedance, whereby said point of low impedance is kept at a voltage which is fixed with respect to a reference voltage so as to minimize cross-talk between conductors via several closed keys thereby eliminating detection of phantom keys.

2. An electronic data input keyboard according to claim 1 wherein each conductive key contact comprises contact sports formed on plastic foils by a silkscreening process and said ohmic resistor connected in series with said contact is provided by said silkscreening process.

3. An electronic data input keyboard according to claim 1 further comprising an operational amplifier having an inverting and non-inverting input and an output, said non-inverting input receiving a fixed reference value, said inverting input constituting said low impedance point, and at least one ohmic resistor (r) connected between said output and said inverting input of said operational amplifier, whereby said inverting input operates as a virtual ground.

4. An electronic data input keyboard according to claim 3 further comprising a diode connected in parallel with said ohmic resistor (r) between said output and said inverting input of said operational amplifier.

5. An electronic data input keyboard according to claim 4, wherein said diode is a zener diode.

6. An electronic data input keyboard according to claim 3 further comprising a capacitor connected parallel to said ohmic resistor (r) between said output and said inverting input of said operational amplifier.

7. The keyboard of claim 1 wherein, said reference voltage is different from a pulse voltage of the scanning pulses.

* * * * *

UNITED STATES PATENT AND TRADEMARK OFFICE
CERTIFICATE OF CORRECTION

PATENT NO. : 4,709,228
DATED : November 24, 1987
INVENTOR(S) : Ernst E. Hucking et al It is certified that error appears in the above-identified patent and that said Letters Patent is hereby corrected as shown below:

IN THE CLAIMS

Claim 2, line 3    change "sports" to --spots--

Signed and Sealed this

Eighteenth Day of December, 1990

Attest:

HARRY F. MANBECK, JR.

*Attesting Officer*    *Commissioner of Patents and Trademarks*